(12) United States Patent
Jensen

(10) Patent No.: US 7,158,064 B2
(45) Date of Patent: Jan. 2, 2007

(54) CONTINUOUS-TIME DELTA-SIGMA ADC WITH PROGRAMMABLE INPUT RANGE

(75) Inventor: Henrik T. Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/301,513

(22) Filed: Dec. 13, 2005

(65) Prior Publication Data

US 2006/0092061 A1    May 4, 2006

Related U.S. Application Data

(63) Continuation of application No. 10/922,532, filed on Aug. 20, 2004, now Pat. No. 6,975,259.

(51) Int. Cl.
*H03M 3/00* (2006.01)

(52) U.S. Cl. ...................................... 341/143; 341/166

(58) Field of Classification Search ........ 341/143–166, 341/118, 120
See application file for complete search history.

(56) References Cited

U.S. PATENT DOCUMENTS

| | | | | |
|---|---|---|---|---|
| 6,184,812 B1 * | 2/2001 | Younis et al. | ............... | 341/143 |
| 6,362,762 B1 * | 3/2002 | Jensen et al. | ............... | 341/143 |
| 6,437,718 B1 * | 8/2002 | Oyama et al. | .............. | 341/143 |
| 6,462,687 B1 * | 10/2002 | Eshraghi et al. | ............ | 341/143 |

* cited by examiner

*Primary Examiner*—Lam T. Mai
(74) *Attorney, Agent, or Firm*—Garlick Harrison & Markison; James A. Harrison

(57) ABSTRACT

A scaled input current is produced that substantially matches the full scale input of a CTΔΣADC that substantially cancels an offset bias current component of the input current. A variable bias resistance value is coupled between the integrator input and one of a supply voltage and a circuit common. The method further includes integrating the input current to produce an integrated signal representing a time averaged value of the input current to substantially remove noise from a frequency band of interest. The integrated signal is produced to a quantizer to produce a feedback current that substantially cancels a quantization noise component in the digital representation of the scaled analog signal by coupling the digital representation of the scaled analog signal to a programmable digital switch wherein the programmable digital switch either sinks current from or sources current to the integrator input.

19 Claims, 18 Drawing Sheets

US 7,158,064 B2

CONTINUOUS-TIME DELTA-SIGMA ADC WITH PROGRAMMABLE INPUT RANGE

CROSS REFERENCE TO RELATE APPLICATIONS

This application is a continuation of Ser. No. 10/922,532 filed on Aug. 20, 2004, U.S. Pat. No. 6,975,259.

BACKGROUND

1. Technical Field

The present invention relates to communication systems and, more particularly, to analog-to-digital and digital-to-analog converters used within transceivers.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standard. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution service (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switched telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.) that performs analog signal processing tasks as a part of converting data to a radio frequency (RF) signal for transmission and a received RF signal to data.

As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and intermediate frequency signals.

A filtering stage filters the low IF signals to attenuate unwanted out of band signals to produce a filtered signal. The data recovery stage recovers raw data from the filtered signal in accordance with the particular wireless communication standard. Alternate designs being pursued at this time further include direct conversion radios that produce a direct frequency conversion often in a plurality of mixing steps or stages.

As an additional aspect, these designs are being pursued as a part of a drive to continually reduce circuit size and power consumption. Along these lines, such designs are being pursued with CMOS technology thereby presenting problems not addressed by prior art designs. For example, one common design goal is to provide an entire system on a single chip. The drive towards systems-on-chip solutions for wireless applications continues to replace traditional analog signal processing tasks with digital processing to exploit the continued shrinkage of digital CMOS technology.

One approach to current designs by the applicant herein is to reduce analog signal processing performance requirements and to compensate for the relaxed performance requirements in the digital domain to provide required system performance. This approach is beneficial in that, in addition to the reduced silicon area requirements, the digital processing is insensitive to process and temperature variations. Applications for which this trend is observed include RF receivers where the received signal is digitized as early as possible in the receiver chain using a high dynamic range analog-to-digital converter (ADC), and in a variety of calibration circuits of the radio where signal levels must be measured accurately over a wide range of values. This trend thus increases the demand for embedded low-power, low-voltage ADCs providing high dynamic range in the interface between the analog and digital processing.

A class of ADCs capable of providing high dynamic range and particularly suitable for low-power and low-voltage implementation is known as continuous-time delta sigma analog-to-digital converters (CTΣΔADCs). These ADCs can be designed to operate with supply voltages in the range of 1.2V-1.5V and current consumption as low as a few hundred μAs.

FIG. 1 shows an example top-level block diagram of the simplest CTΣΔADC, namely, the first-order low pass CTΣΔADC. The applicant specifically notes that the discussion of FIGS. 1–3 herein the Background section is intended solely as a discussion of related technology or art and in no way constitutes an admission that the circuit shown in FIGS. 1–3 and the corresponding discussion below is prior art.

The input signal to the CTΣΔADC of FIG. 1 is a voltage source labeled s(t). An operational amplifier with negative capacitive feedback constitutes an integrator formed by the operational amplifier and capacitor in a feedback loop, which integrates the input current labeled $i_s(t)$ flowing from an input signal s(t) to produce an analog integrator output voltage. A coarse (in this example 2-bit) quantizer converts the analog integrator output voltage signal to a digital format shown as y(t). The quantizer, by providing a 2-bit output, defines which of four voltage levels most closely match the analog integrator output voltage. More specifically, the quantizer produces a 2-bit output having values of 00, 01, 10 and 11.

The quantizer typically includes an array of comparators, essentially 1-bit ADCs, whose output is either "high" or "low" depending upon the magnitude of the integrator voltage relative to a reference signal generated by a reference generator. A digital-to-analog converter (DAC) provides a feedback current responsive to a logic value ("1" or "0") of ADC output to the integrator. FIG. 2 shows one implementation of the 2-bit quantizer that produces the 2-bit feedback to the DAC. The quantizer sums the output values of the array of comparators to produce the 2-bit output discussed above.

FIG. 3 shows an alternative model of the first-order CTΣΔADC of FIG. 1, wherein the quantizer has been replaced with an additive noise source q(t). The model of FIG. 3 is one that represents the CTΣΔADC of FIG. 1. Because the operation of the quantizer is deterministic, a signal q(t) may be defined such that the CTΣΔADC of FIG. 3 behaves similarly to the CTΣΔADC of FIG. 1. The digital ADC output, here denoted y(t), can then be written as a sum of two terms, namely, a term related to the input signal, $y_s(t)$, and a term related to the quantization noise, $y_q(t)$, i.e., $$y(t)=y_s(t)+y_q(t) \quad (1)$$

By employing feedback around the integrator and quantizer combination, it is possible to suppress the quantization noise component $y_q(t)$ in a limited frequency range around DC. Specifically, it can be shown that $y_q(t)$ results from q(t) being filtered by a first-order high-pass filter, commonly referred to as the noise transfer function, NTF(s), i.e., in terms of Laplace transforms, $$Y_q(s)=NTF(s) \times Q(s). \quad (2)$$

Similarly, for a low-frequency input signal s(t), it can be shown that the signal component $y_s(t)$ equals the input signal, i.e., in terms of Laplace transforms, $$Y_s(s)=S(s). \quad (3)$$

The above properties explain the terminology "low pass" CTΣΔADC; if s(t) is a low frequency input signal, the ADC output y(t) closely resembles s(t) when considering only the low frequency region of y(t), i.e., the ADC "passes" signals of low frequency from analog to digital format without alteration. Furthermore, the low pass CTΣΔADC of FIG. 1 is of first-order since the single integrator gives rise to a first order high pass filter. More integrators can, in principle, be added to yield higher order filtering of the quantization noise as is described further below. Generally, an $N^{th}$ order CTΣΔADC contains N integrators.

Ideally, in equation (2), the quantization noise q(t) is uncorrelated with the input signal s(t) and closely resembles white noise of power $\Delta^2/12$, where Δ is the quantizer step size (see FIG. 2) as long as the input signal is limited such that the quantizer operates in the no-overload region. In this case, the two terms that constitute y(t) in equation (1) are uncorrelated, or, equivalently, $y_q(t)$ closely resembles white noise, uncorrelated with the input, and filtered by the high pass filter NTF(s). In this case, since NTF(s) is deterministic, the power of the quantization noise measured over a given signal band-width, $f_c$, of the ADC output y(t) can be determined using standard linear systems analysis as $$P_n = \int_{f=0}^{f=f_c} \frac{\Delta^2}{12} |NTF(e^{j2\pi f})|^2 \, df. \quad (4)$$

For a given known input signal power, $P_s$, the signal-to-noise ratio (SNR)—a measure of the quality of the analog-to-digital conversion process—can then be calculated a—priori according to $$SNR = \frac{P_s}{P_n}. \quad (5)$$

Some properties of the ideal CTΣΔADC, where q(t) resembles white and random noise, follow from (4) and (5). For a given fixed $f_c$, which depends upon the particular application, the SNR depends upon the input as would be expected from a linear system with q(t) contributing constant noise power at the output. In other words, any change of signal power leads to an identical change of SNR in the ADC output. For example, suppose that the signal power is doubled, e.g., increases by 6 dB, it then follows from (5) that the SNR increases by 6 dB.

Being able to a-priori reliably predict the SNR of the analog-to-digital converted signal, as in equations (4) and (5), is extremely important in almost all applications. Having a-priori knowledge of the SNR delivered by the ADC to within tight tolerances allows system designers to quantify the performance and behavior of the overall system under a variety of different operating conditions. In practice, in order to produce the SNR needed for accurate digital processing of the input signal s(t), a digital filter is used to filter out frequency components above $f_c$ in the ADC output signal. As a result of this filtering process, the coarsely quantized output of the CTΣΔADC undergoes a significant increase in bit-resolution.

As it is obviously desirable to maintain a maximum signal-to-noise ratio, it is commonplace to optimize a particular ADC to compensate for various non-changing signal conditions to process a maximum signal swing. Accordingly, if a signal characteristic changes, the performance of the ADC may be reduced and, alternatively, the signal-to-noise ratio of the ADC may be reduced. For example, a single signal source may, for a variety of reasons, have changing levels of a DC component of a signal due to circuit operational mode or conditions. Alternatively, a single ADC may be used to sample signals from one of a plurality of signal sources. Each signal source may well have differing DC components thereby negatively affecting the performance of the ADC. Due to power and dye footprint restrictions in wireless transceivers, a single ADC may be used for multiple applications. Such reuse of the ADC, however, creates the problems previously mentioned. Thus, a need exists for an ADC architecture that provides adaptability to input signal DC component variations to maintain a maximal signal-to-noise ratio and, more generally, to provide for optimal ADC performance.

SUMMARY OF THE INVENTION

The present invention employs a mixture of digital signal processing and analog circuitry to substantially improve the linear behavior of the basic low-order CTΣΔADC architectures. In one embodiment of the invention, a programmable current source that may sink or source current is coupled across an input resistor to sink or source current from an input node of the CTΣΔADC. The amount of current that is produced or sunk by the current source and a value of the input resistive value selectably programmable and may be used to compensate for DC current components of the signal s(t) and to compensate for signal swing to avoid overloading the operational amplifier based on changes in the input signal.

The programmable resistor generating a programmable input signal current, $i_s(t)$ according to $$i_s(t) = \frac{s(t) - V_B}{R_I}.$$

The operational amplifier of an integrator of the CTΣΔADC keeps a voltage at the negative terminal of the amplifier equal to the constant bias voltage at the positive terminal, $V_B$. This offset current also is programmable. The input signal may be written as the sum of a bias term or, equivalently, a DC term and an AC term, as follows:

$$s(t) = s_{DC} + s_{AC}(t).$$

Therefore, the input current signal has a DC component of $$i_{DC} = \frac{s_{DC}}{R_I}. \tag{8}$$

The parameters are thus selected to compensate for a offset bias current component of an input signal.

A method of the embodiments of the present invention comprise receiving an analog signal at an input of the CTΔΣADC, producing a scaled input current based on the received analog signal, wherein the scaled input current substantially matches the full scale input of the CTΔΣADC, and generating a bias current that substantially cancels an offset bias current component of the input current. In one embodiment, this step includes selecting and coupling a variable bias resistance value between the integrator input and one of a supply voltage and a circuit common. The method further includes integrating the input current to produce an integrated signal representing a time averaged value of the input current to substantially remove noise from a frequency band of interest.

The method further includes coupling the integrated signal to a quantizer to produce a digital representation of the scaled analog signal coupling the digital representation of the scaled analog signal to a digital-to-analog converter (DAC) to produce a feedback current that substantially cancels a quantization noise component in the digital representation of the scaled analog signal. Producing the feedback current comprises coupling the digital representation of the scaled analog signal to a programmable digital switch wherein the programmable digital switch either sinks current from or sources current to the integrator input.

Other aspects of the present invention will become apparent with further reference to the drawings and specification, which follow.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 4:
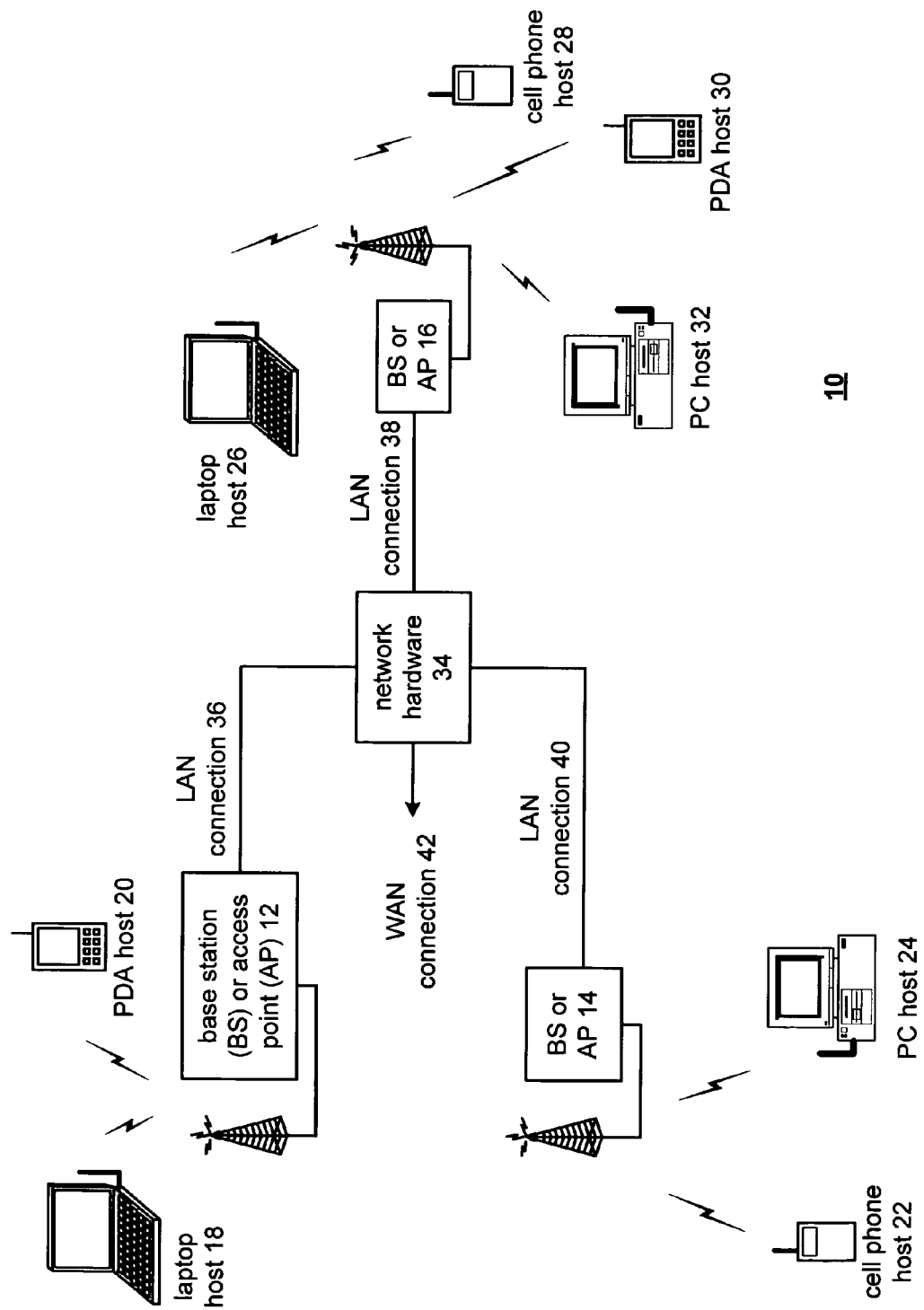
FIG. 4 is a functional block diagram illustrating a communication system that includes a plurality of base stations or access points, a plurality of wireless communication devices and a network hardware component.

FIG. 4 is a functional block diagram illustrating a communication system 10 that includes a plurality of base stations or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 5.

The base stations or access points 12–16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10. Each of the base stations or access points 12–16 has an associated antenna or antenna array to communicate with the wireless communication devices in its area. Typically, the wireless communication devices 18–32 register with the particular base station or access points 12–16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. Any one of the wireless communication devices of FIG. 4 may employ the adaptable ADC of the present invention as is described in greater detail below.

Figure 5:
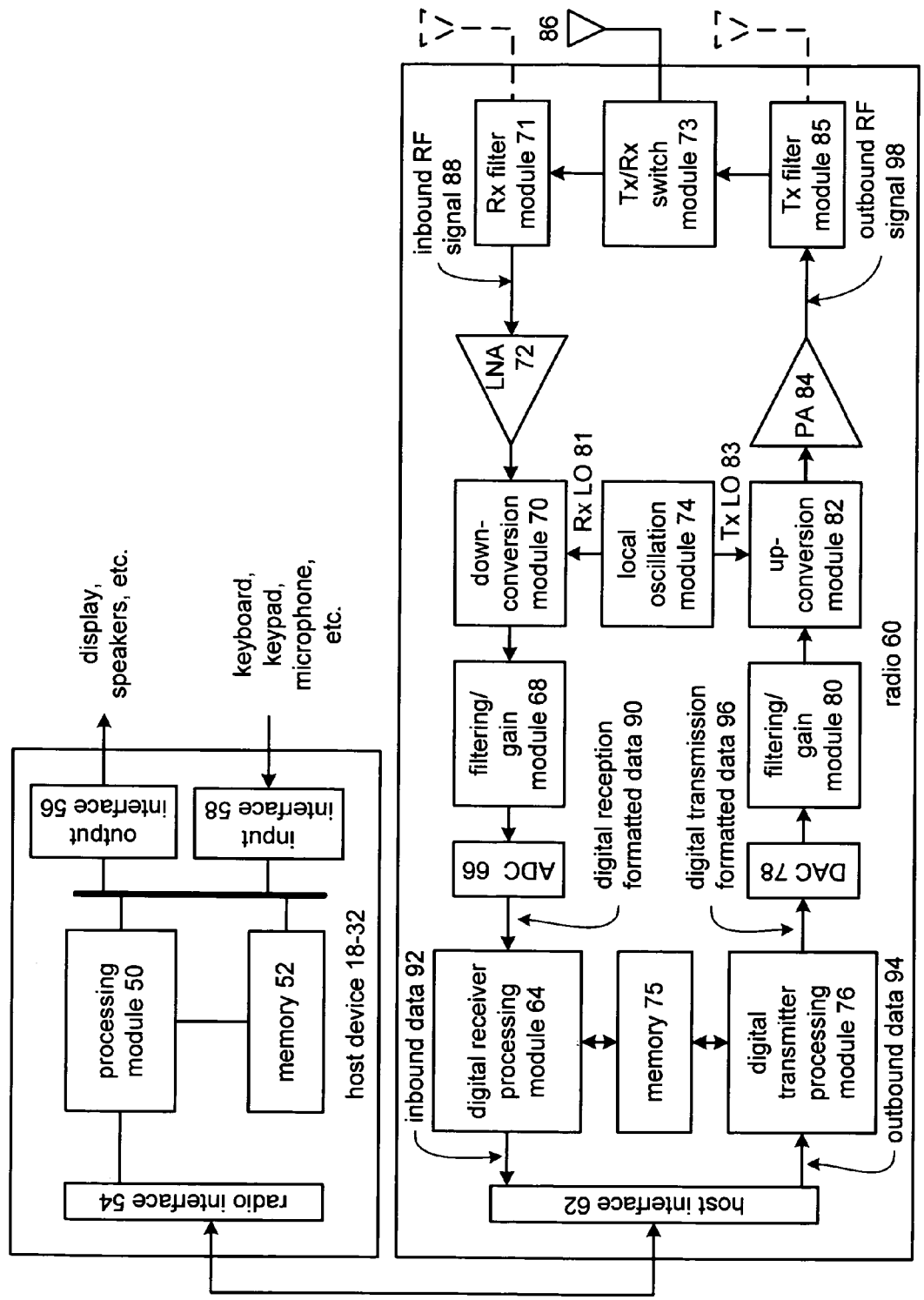
FIG. 5 is a schematic block diagram illustrating a wireless communication device that includes a host device and an associated radio.

FIG. 5 is a schematic block diagram illustrating a wireless communication device that includes the host device 18–2 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, a radio interface 54, an input interface 58 and an output interface 56. The processing module 50 and memory 52 execute the corresponding instructions that are typically done by the host device 18–32. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device such as a display, monitor, speakers, etc., such that the received data may be displayed. The radio interface 54 also provides data from the processing module 50 to the radio 60. The processing module 50 may receive the outbound data from an input device, such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/RX) switch module 73, a local oscillation module 74, memory 75, a digital transmitter processing module 76, a digital-to-analog converter 78, a filtering/gain module 80, an IF mixing up-conversion module 82, a power amplifier 84, a transmitter filter module 85, and an antenna 86. The antenna 86 is shared by the transmit and receive paths as regulated by the Tx/Rx switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and/or modulation. The digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and the digital receiver processing module 64 and/or the digital transmitter processing module 76 executes, operational instructions corresponding to at least some of the functions illustrated herein.

In operation, the radio 60 receives outbound data 94 from the host device 18–32 via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. The digital transmission formatted data 96 will be a digital baseband signal or a digital low IF signal, where the low IF signal typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal or low IF signal into an RF signal based on a transmitter local oscillation 83 provided by local oscillation module 74. Local oscillation module 74 is, in one embodiment of the invention, a multi-stage mixer as described herein. The power amplifier 84 amplifies the RF signal to produce an outbound RF signal 98, which is filtered by the transmitter filter module 85. The antenna 86 transmits the outbound RF signal 98 to a targeted device, such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch module 73, where the Rx filter module 71 bandpass filters the inbound RF signal 88. The Rx filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation 81 provided by local oscillation module 74. Local oscillation module 74 is, in one embodiment of the invention, a multi-stage mixer as described herein. The down-conversion module 70 provides the inbound low IF signal or baseband signal to the filtering/gain module 68. The filtering/gain module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 5 may be implemented using one or more integrated circuits. For example, the host device may be implemented on a first integrated circuit, while the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device 18–32 and the digital receiver processing module 64 and the digital transmitter processing module 76 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

The wireless communication device of FIG. 5 is one that may be implemented to include either a direct conversion from RF to baseband and baseband to RF or for a conversion by way of a low intermediate frequency. In either implementation, however, for the up-conversion module 82 and the down-conversion module 70, it is required to provide accurate frequency conversion. For down-conversion module 70 and up-conversion module 82 to accurately mix a signal, however, it is important that local oscillation module 74 provide an accurate local oscillation signal for mixing with the baseband or RF by up-conversion module 82 and down-conversion module 70, respectively. Accordingly, the local oscillation module 74 includes circuitry for adjusting an output frequency of a local oscillation signal provided therefrom. As will be explained in greater detail below, the local oscillation module 74 includes a multi-stage that receives a frequency correction input that it uses to adjust an output local oscillation signal to produce a frequency corrected local oscillation signal output. While one embodiment of the present invention includes local oscillation module 74, up-conversion module 82 and down-conversion module 70 that are implemented to perform direct conversion between baseband and RF, it is understood that the principles herein may also be applied readily to systems that implement an intermediate frequency conversion step at a low intermediate frequency.

Within host device 18–32, as shown in FIG. 5, multiple applications for an ADC exist. First, a received RF must be converted to a digital signal by an ADC, such as ADC 66, for subsequent processing by digital receiver processing module 64. Additionally, however, ADCs may also be used for providing signal magnitude and phase information to logic or to a processing module, such as a front end processor, for circuit calibration purposes.

Figure 6:
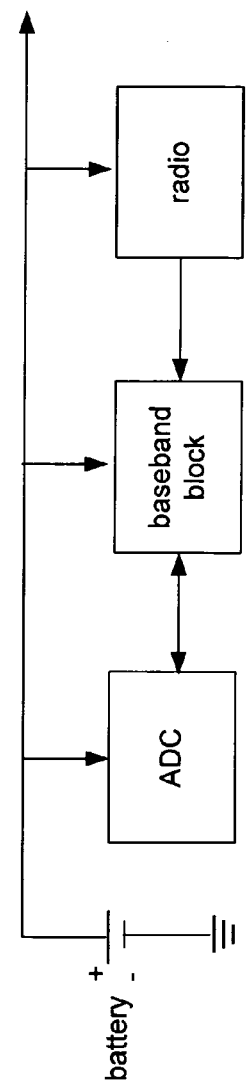
FIG. 6 shows a second example of an ADC in a wireless radio application for monitoring a battery level.

FIG. 6 shows a second example of an ADC in a wireless radio application for monitoring a battery level. The digital baseband processor of FIG. 6 leads the battery voltage level via the ADC in regular intervals and generates alerts if a battery level goes below critical levels. Other similar monitoring applications, such as temperature sensing, may be employed by these low power ADCs in wireless transceivers.

Figure 7:
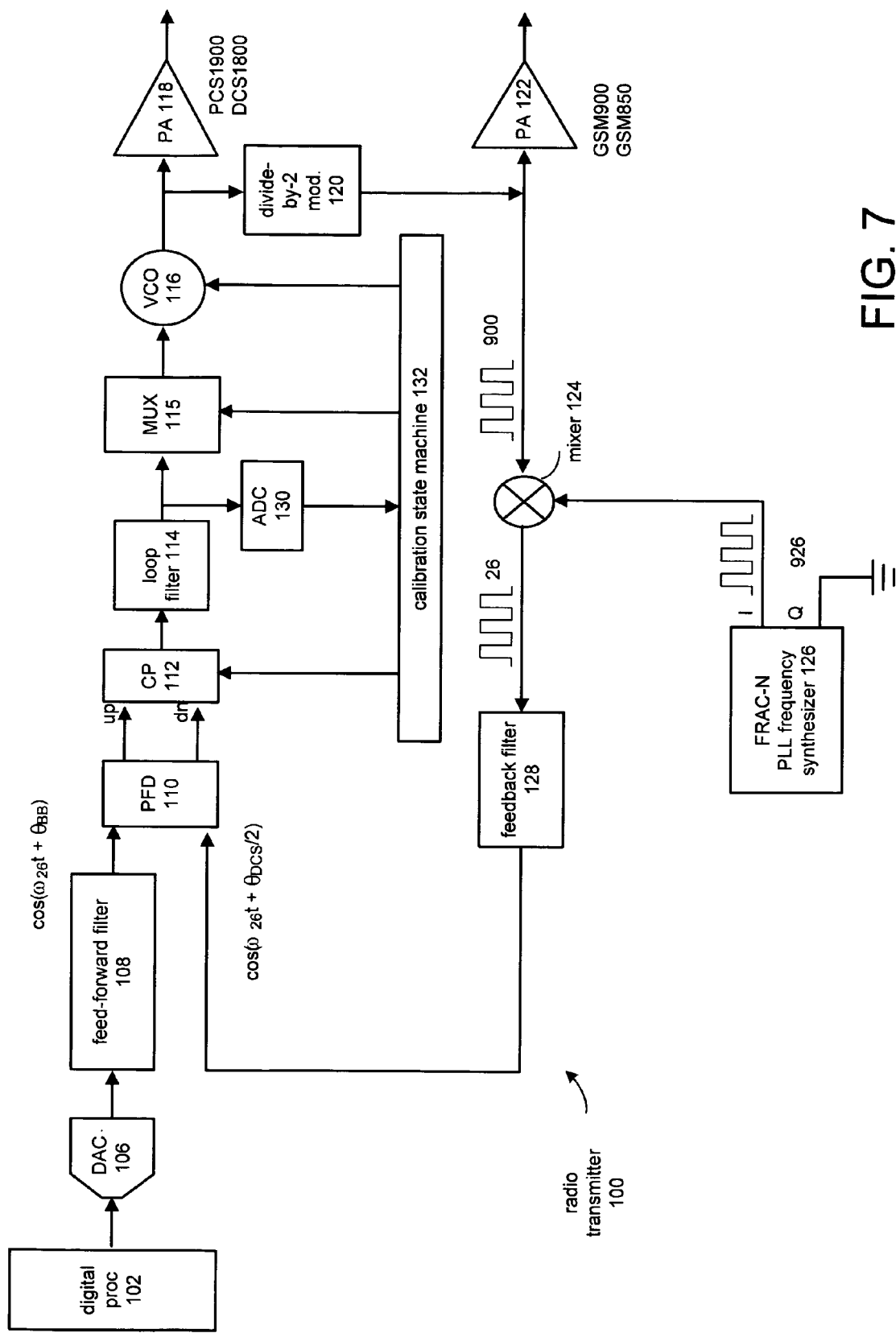
FIG. 7 is a functional block diagram of a radio transmitter formed according to one embodiment of the present invention.

FIG. 7 is a functional block diagram of a radio transmitter formed according to one embodiment of the present invention. FIG. 7 shows but one of a large number of applications for an ADC formed according to an exemplary embodiment of the invention. A radio transmitter 100 includes a digital processor 102 that produces digital data that define a phase and a frequency of a phase modulated signal. A digital-to-analog converter (DAC) module 106 is coupled to receive the digital data and produces a continuous waveform signal to a filter 108. Filter 108 produces a filtered analog signal as a reference signal to a phase frequency detector (PFD) 110. In one embodiment of the invention, the digital rate (data??) is produced with a high sample rate such that, when converted to analog and filtered, an intermediate frequency (IF) signal is produced. The filtered signal, which may be represented as $\cos(\omega_{26} t + \theta_{BB})$, is a continuous waveform signal having a frequency of 26 MHz. In the described embodiment, the frequency of oscillation is 26 MHz, though the output frequency is a function of the digitized IF signal produced by digital processor 102. Not only is the frequency of the filtered IF signal produced by filter 108 determined by digital processor 102, but also the phase, as defined by in-phase and quadrature component values. Accordingly, when radio transmitter 100 is a GSM transmitter, digital processor 102 further defines a phase of the filtered IF signal ($\theta_{BB}$) as a part of phase modulating the signal that is ultimately radiated as a radio frequency transmit signal.

Alternatively, the digital data may be produced at a sample rate such that, when converted to analog and filtered, produces one of a baseband or low IF signal. Circuits for up-converting the baseband or low IF signal are known. Regardless of the frequency of the filtered analog signal, the PFD 110 of FIG. 7 receives the filtered analog signal and produces control signals to a charge pump (CP) 112 that, responsive to the control signals, produces a corresponding error current signal. A loop filter 114 is coupled to receive the error current signal and to produce a corresponding error voltage signal to a MUX 115 that, in turn, produces the error voltage signal to a voltage controlled oscillator (VCO) 116. The VCO 116 produces an oscillation, which here also is the RF transmit signal. In the described embodiment, the RF transmit signal produced by VCO 116 is produced to a power amplifier 118 for amplification and radiation from an antenna.

In the specific embodiment of FIG. 7, radio transmitter 100 is a GSM-based radio transmitter. Accordingly, the output oscillation or carrier frequency of the RF transmit signal produced by VCO 116 is equal to one of 1800 or 1900

MHz. Power amplifier 118 then receives the 1800 or 1900 MHz GSM phase modulated signal for amplification. Within the GSM domain, however, other frequencies of interest are 850 and 900 MHz. Accordingly, as may be seen, a divide-by-2 module 120 is coupled to receive the RF transmit signal produced by VCO 116 and produces one of a 900 MHz signal or an 850 MHz signal according to whether the RF transmit signal was a 1900 MHz signal or an 1800 MHz signal. The output of divide-by-2 module 120 is then received by power amplifier 122 that amplifies the signal for propagation from an antenna.

For the purposes of the present example, assume that VCO 116 produces an output frequency oscillation of 1800 MHz as the RF transmit signal. Accordingly, divide-by-2 module 120 produces a 900 MHz signal to power amplifier 122. The 900 MHz signal is further produced to a mixer 124 that is further coupled to receive a 926 MHz signal from a FRAC-N phase locked loop (PLL) frequency synthesizer 126. As is known by one of average skill in the art, mixer 124 multiplies or mixes the two input signals, here 900 MHz and 926 MHz, to produce a 26 MHz output signal. The 26 MHz output signal is produced to a feedback filter 128 that filters the 26 MHz signal to produce a 26 MHz feedback signal that may be represented as $\cos(\omega_{26} t+\theta_{DCS}/2)$. The feedback signal is produced to PFD 110 that compares the phase of the feedback signal to the filtered IF signal (the reference signal) to cause the output phase of the RF transmit signal produced by VCO 116 to track the phase of the filtered IF signal that was produced from the digitized IF signal generated by digital processor 102.

In analyzing the feedback signal produced by feedback filter 128, one may note that the frequency is 26 MHz for the described embodiment. Additionally, the phase modulation index, represented by $\theta_{DCS}/2$, generally illustrates that the phase modulation index has been divided by 2. This phase modulation index is divided by 2 by the divide-by-2 module 120. Divide-by-2 module 120 not only divides the frequency by 2, but also the phase modulation index. Accordingly, as will be described in greater detail below, digital processor 102 selectively adjusts the phase modulation index according to whether the RF transmit signal is output before or after the divide-by-2 module 120. More specifically, if the RF transmit signal is amplified and propagated by power amplifier 118, then digital processor 102 adjusts the phase modulation index by one-half. If power amplifier 118 is turned off and the RF transmit signal is divided by 2, and the phase modulation index is divided by 2, by divide-by-2 module 120 prior to amplification and transmission from power amplifier 122, digital processor 102 does not adjust the phase modulation index.

Above it was mentioned that FRAC-N PLL frequency synthesizer 126 produces a 926 MHz signal to mixer 124. The output of mixer 124, therefore, is a 26 MHz signal. It is understood, of course, that the output frequency provided by FRAC-N PLL frequency synthesizer 126 will be a function of the output frequency provided by the divide-by-2 module 120. As is known by one of average skill in the art, a mixer, such as mixer 124, will output a frequency reflecting a difference of the two input frequencies. Accordingly, the frequency of FRAC-N PLL frequency synthesizer 126 is selected so that, when mixed with the output of divide-by-2 module 120, a desired frequency feedback signal (here, 26 MHz) is produced to feedback filter 128.

Figure 1:
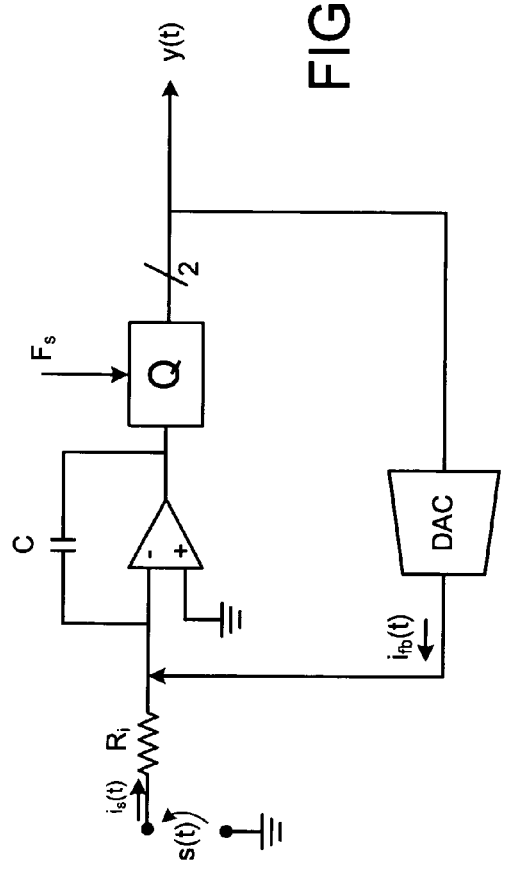
FIG. 1 shows an example top-level block diagram of a first-order low pass CTΣΔADC.
Figure 2:
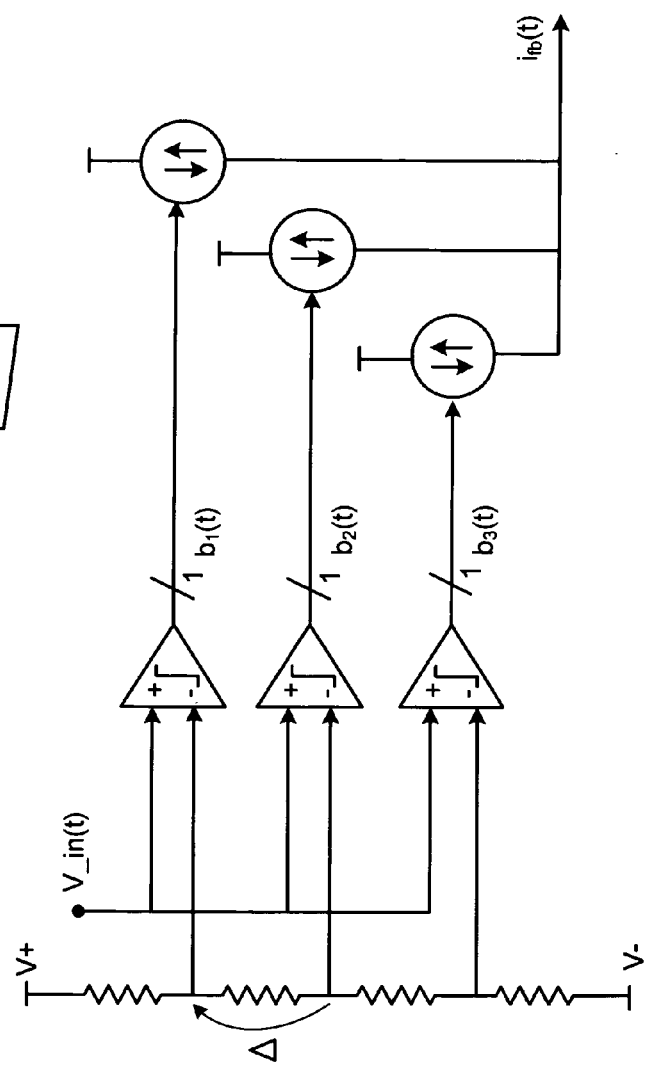
FIG. 2 shows one implementation of the 2-bit quantizer that produces a 2-bit feedback to a DAC.
Figure 3:
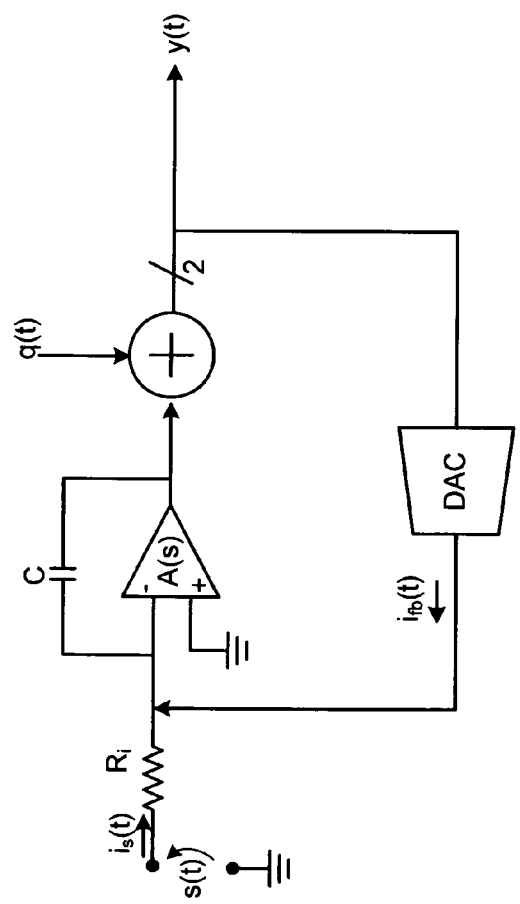
FIG. 3 shows an alternative model of the first-order CTΣΔADC that includes an additive noise source q(t)

An ADC 130, formed according to one embodiment of the present invention, also is coupled to receive the output error voltage signal of loop filter 114. ADC 130 converts the error voltage signal to a digital signal that is produced to a calibration state machine 132 that, based upon the digital signal produced by ADC 130, generates control signals to at least one of CP 112, MUX 115 and VCO 116 to adjust operation of the translational loop of FIG. 3. Operation of calibration state machine 132 is described herein to illustrate one potential application of an inventive ADC such as ADC 130. Generally, low order ADCs having wide dynamic range as disclosed herein may be used through a system for converting analog signals to digital for use in signal process control.

Figure 8:
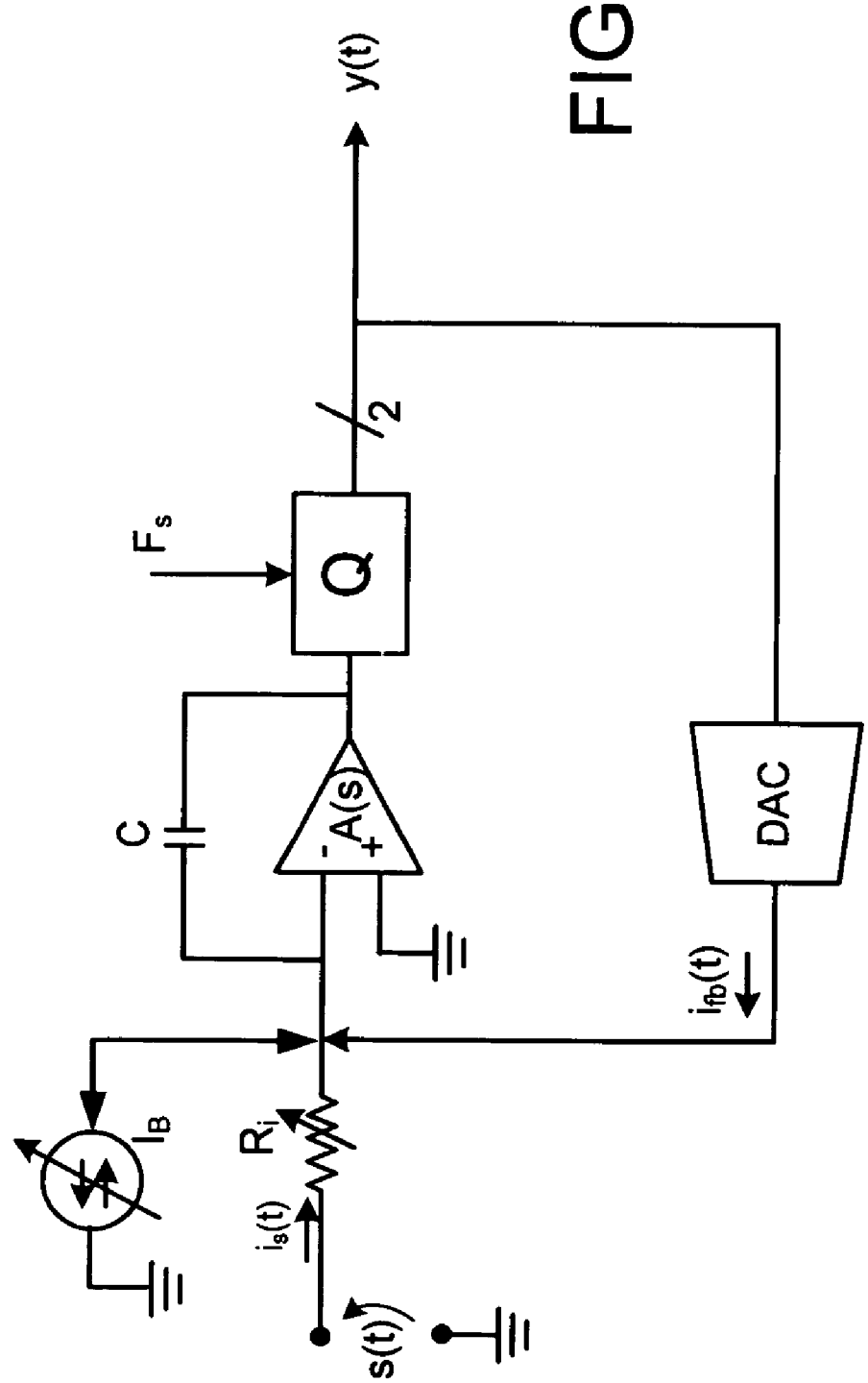
FIG. 8 is a functional schematic diagram of a first-order CTΣΔADC formed according to one embodiment of the present invention.

FIG. 8 is a functional schematic diagram of a first order CTΣΔADC formed according to one embodiment of the present invention. The circuit of FIG. 8 shows conceptual mechanisms for input range programmability. As may be seen, an input s(t) is produced to a variable resistor $R_I$ prior to being produced to a negative terminal of an operational amplifier. Additionally, a current source that may sink or source current is further coupled to the negative input node of the operational amplifier. The amount of current that is produced or sunk by current source $I_B$ and the amount of the resistive value of $R_I$ are selectably programmable and may be used to compensate for DC current components of the signal s(t) and to compensate for signal swing to avoid overloading the operational amplifier based on changes in the input signal.

The arrow over the input resistor $R_I$ indicates a programmable resistor generating a programmable input signal current, $i_s(t)$ according to $$i_s(t) = \frac{s(t) - V_B}{R_I}. \tag{6}$$

The operational amplifier of the integrator keeps the voltage at the negative terminal equal to the constant bias voltage at the positive terminal, $V_B$. Also included in FIG. 8 is an input offset current generator that generates an offset current $I_B$. This offset current may also be programmable. The input signal may be written as the sum of a bias term or, equivalently, a DC term and an AC term, as follows:

$$s(t) = s_{DC} + s_{AC}(t). \tag{7}$$

Therefore, from (6) one may determine that the input current signal has a DC component of $$i_{DC} = \frac{s_{DC}}{R_I}. \tag{8}$$

Thus, to find the bias point of the input signal, it is noted that the total sum of bias currents going into the input node must be zero, i.e., $$I_B + i_{DC} = 0$$

or, equivalently, $$s_{DC} = -I_B R_I. \tag{9}$$

Figure 9:
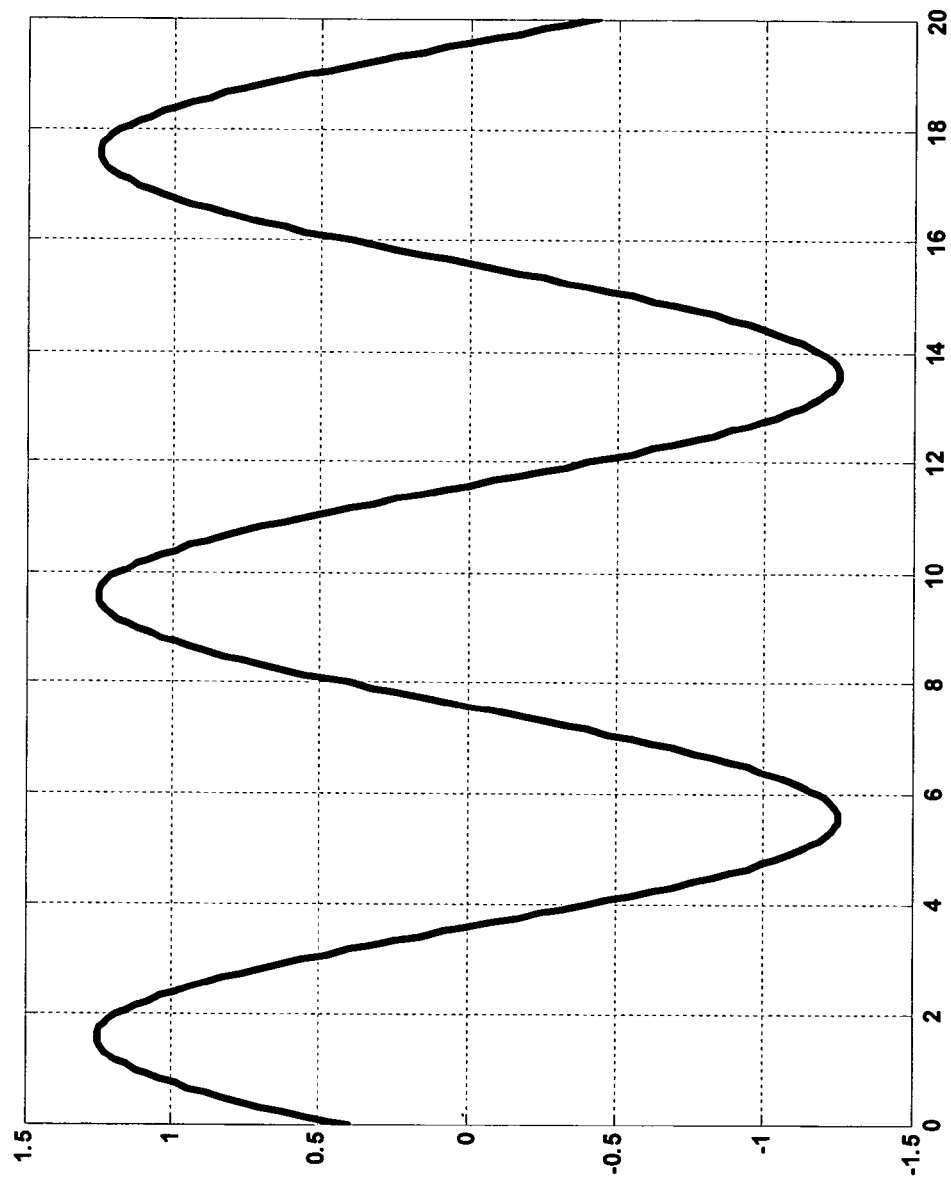
FIG. 9 shows an example input signal to the CTΣΔADC.

FIG. 9 shows an example input signal to the CTΣΔADC of FIG. 8 where $I_B=0$ and $R_I$ and the DAC are such that the input and feedback currents are equal for equal inputs, i.e., $$i_s(t)|_{s(t)=1} = i_{fb}(t)|_{y(t)=1}. \tag{10}$$

The input resistor that satisfies this requirement is referred to as $$R_{REF}. \tag{11}$$

Specifically, the signal is a 125 kHz sinusoid of amplitude 1.25V and thus is of the form (7) where $$s_{DC}=0; s_{AC}(t)=1.25 \sin(2\pi 125 e^3). \quad (12)$$

Figure 10:
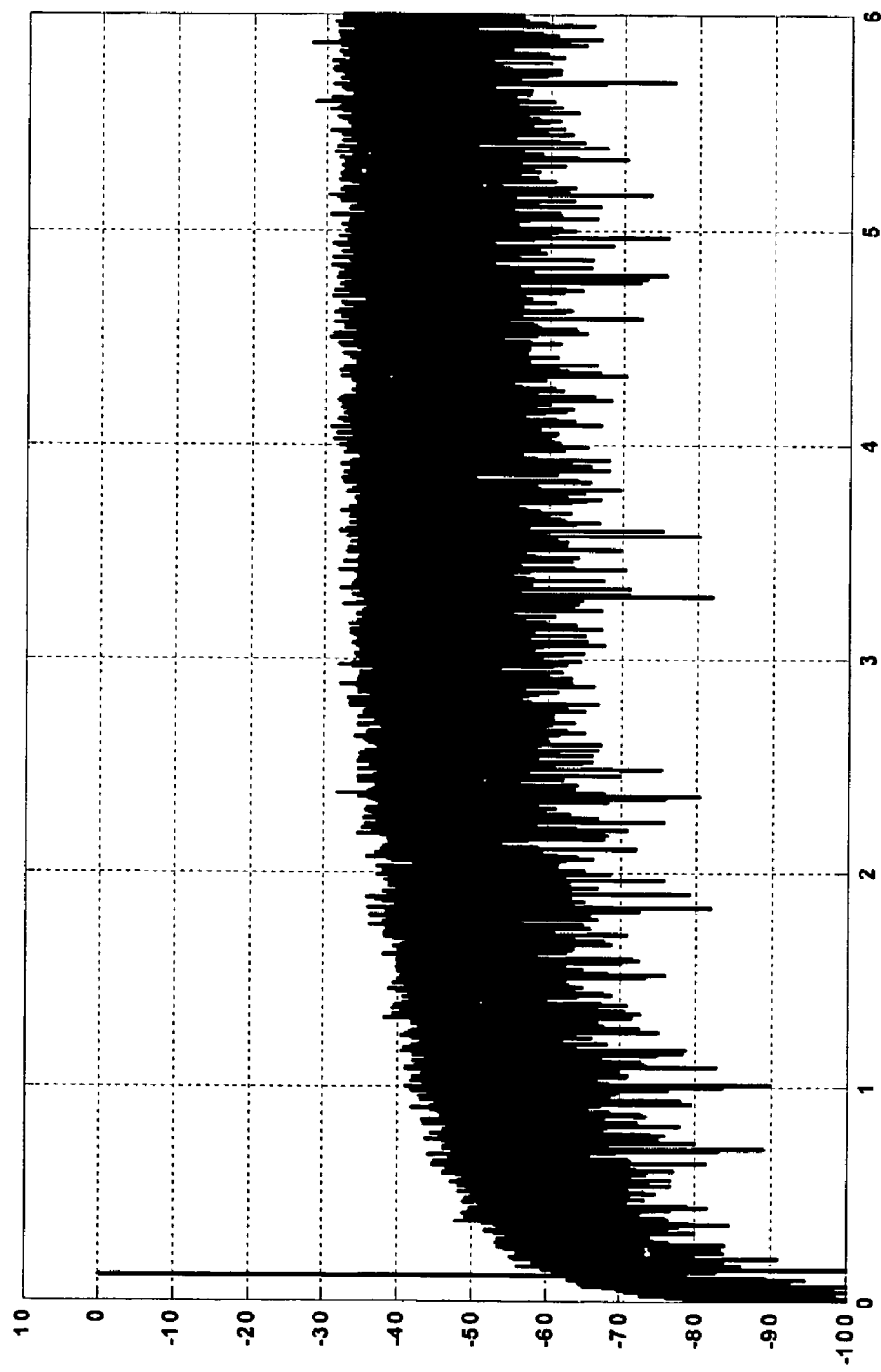
FIG. 10 shows the simulated power spectral density (PSD) of the CTΣΔADC output.

FIG. 10 shows the simulated power spectral density (PSD) of the CTΣΔADC output when driven by the signal defined in (10). Clearly, the first-order highpass quantization noise shaping discussed in the above is observed.

Figure 11:
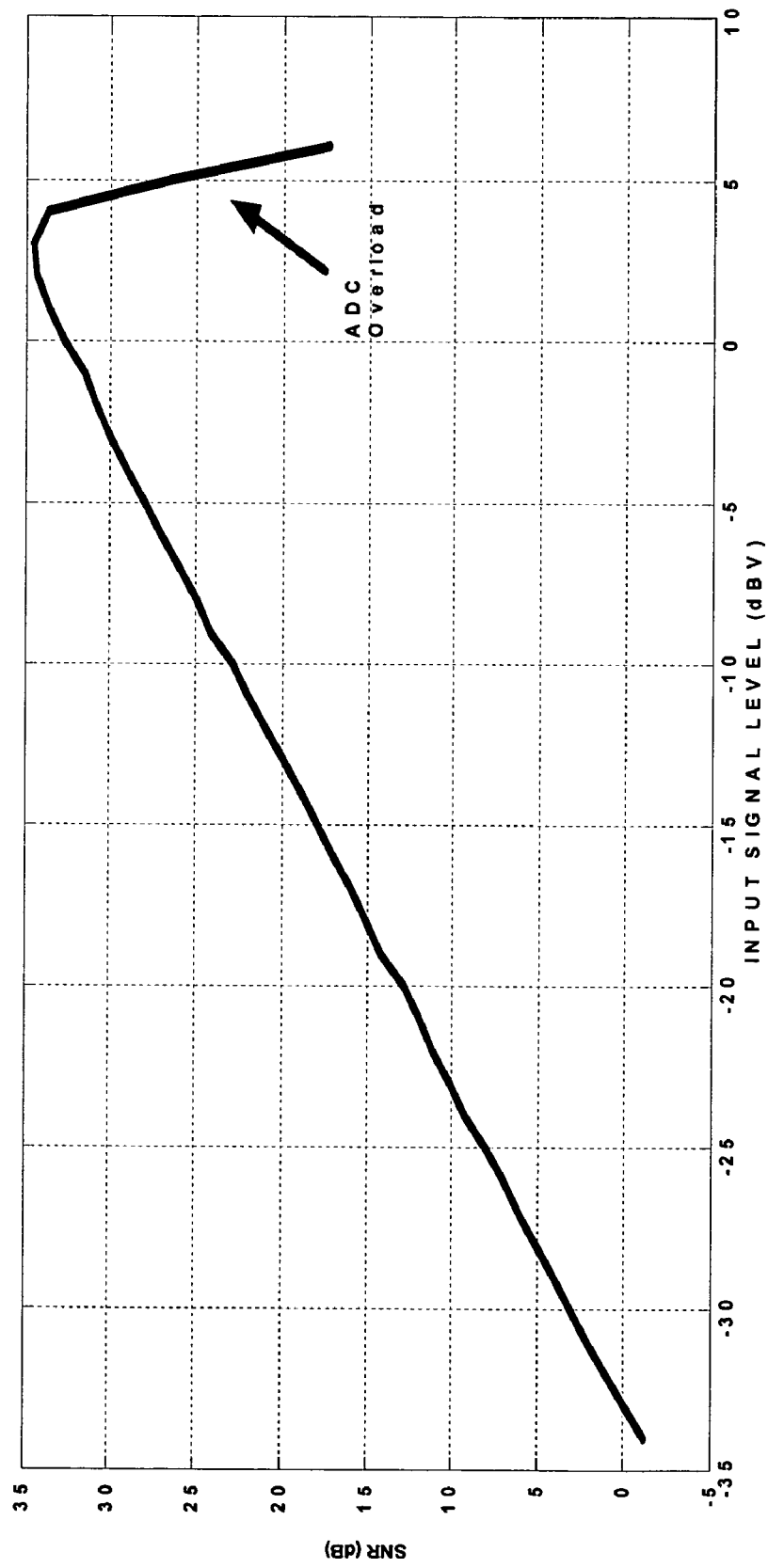
FIG. 11 shows the simulated SNR over a 400 kHz bandwidth.

FIG. 11 shows the simulated SNR over a 400 kHz bandwidth calculated as defined in (4) and (5). For a large range of input voltages, the SNR (measured in dB) increases linearly with input power measured in dB, as desired. At some point, around an input voltage of 1.25V, the ADC overloads, and the SNR decreases rapidly with increasing input amplitude. Thus, the peak SNR of this ADC is approximately 34.5 dB and is reached with an input amplitude of 1.25V. This signal level is referred to as the full scale signal.

Figure 12:
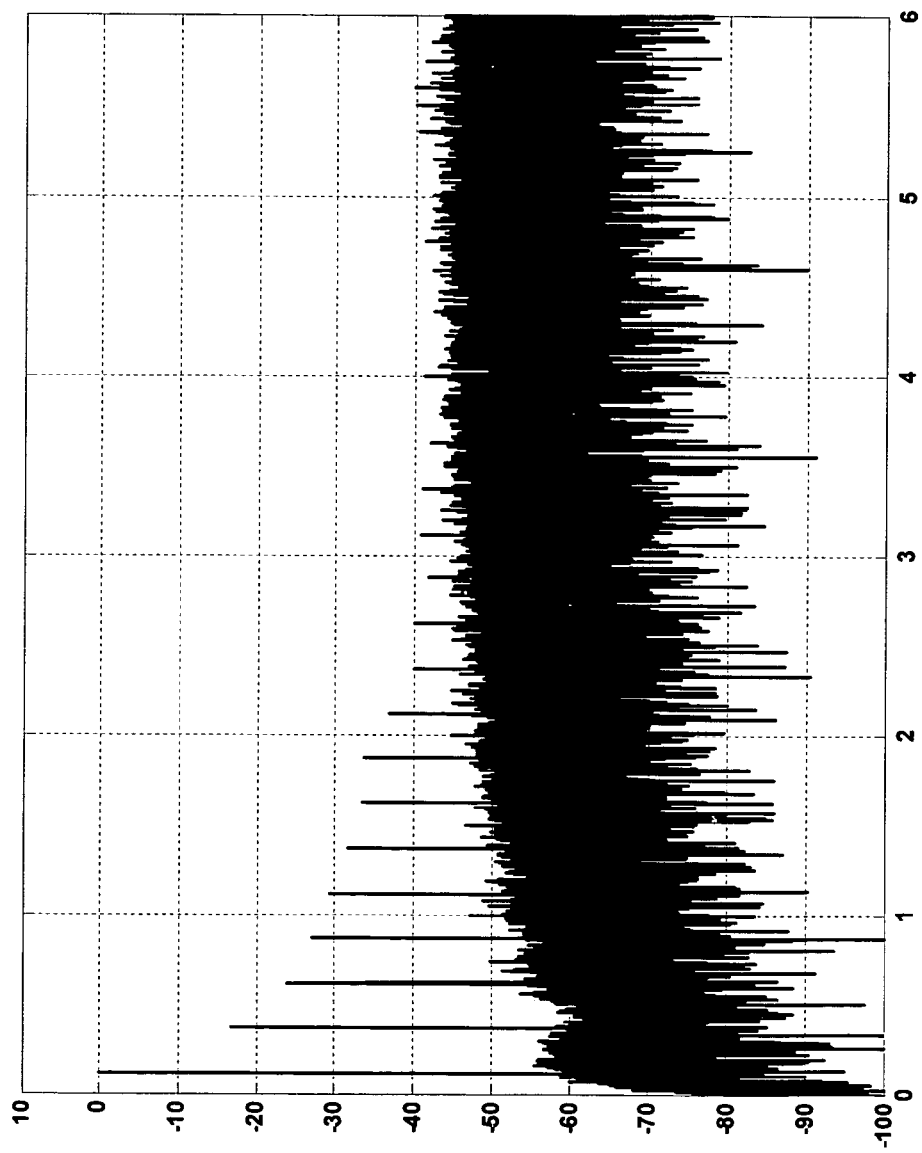
FIG. 12 is an example of the PSD of the CTΣΔADC output when the ADC is operating in the overload region.

FIG. 12 is an example of the PSD of the CTΣΔADC output when the ADC is operating in the overload region. As can be seen, multiple spurious tones arise and the uniform high pass shaping of the quantization noise breaks down, resulting in poor SNR.

Figure 13:
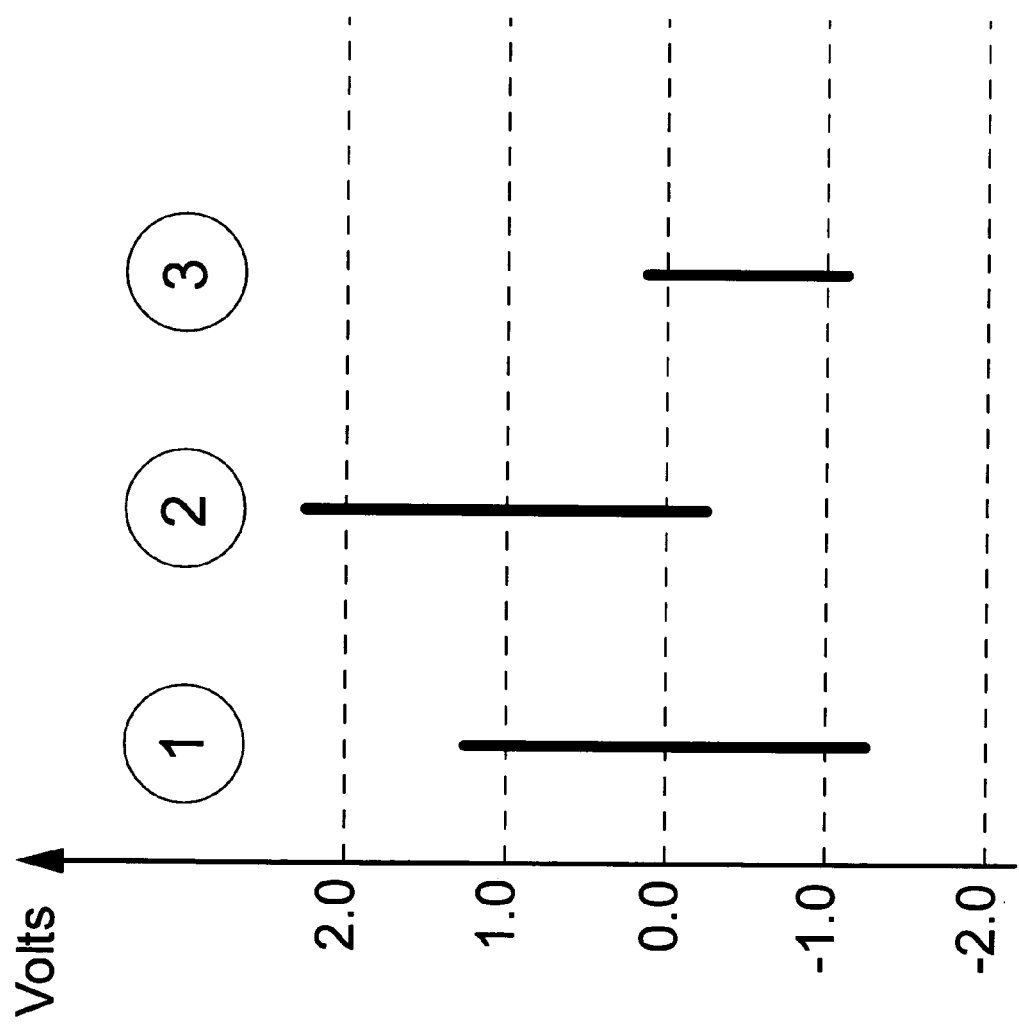
FIG. 13 shows three different example input ranges that can be achieved for the CTΣΔADC.

FIG. 13 shows three different example input ranges that can be achieved for the CTΣΔADC of FIG. 7 without sacrificing SNR by applying the circuitry specified in the above. Input range 1, i.e., the range

[−1.25; 1.25] Volts corresponds to the input range in the above example. Input range 2, i.e., the range

[−0.25; 2.25] Volts corresponds to input range 1 with a DC offset of +1.0 Volt. Thus, according to (9), an input offset current generator must be applied such that $$I_B = -\frac{1.0}{R_I}. \quad (13)$$

Figure 14:
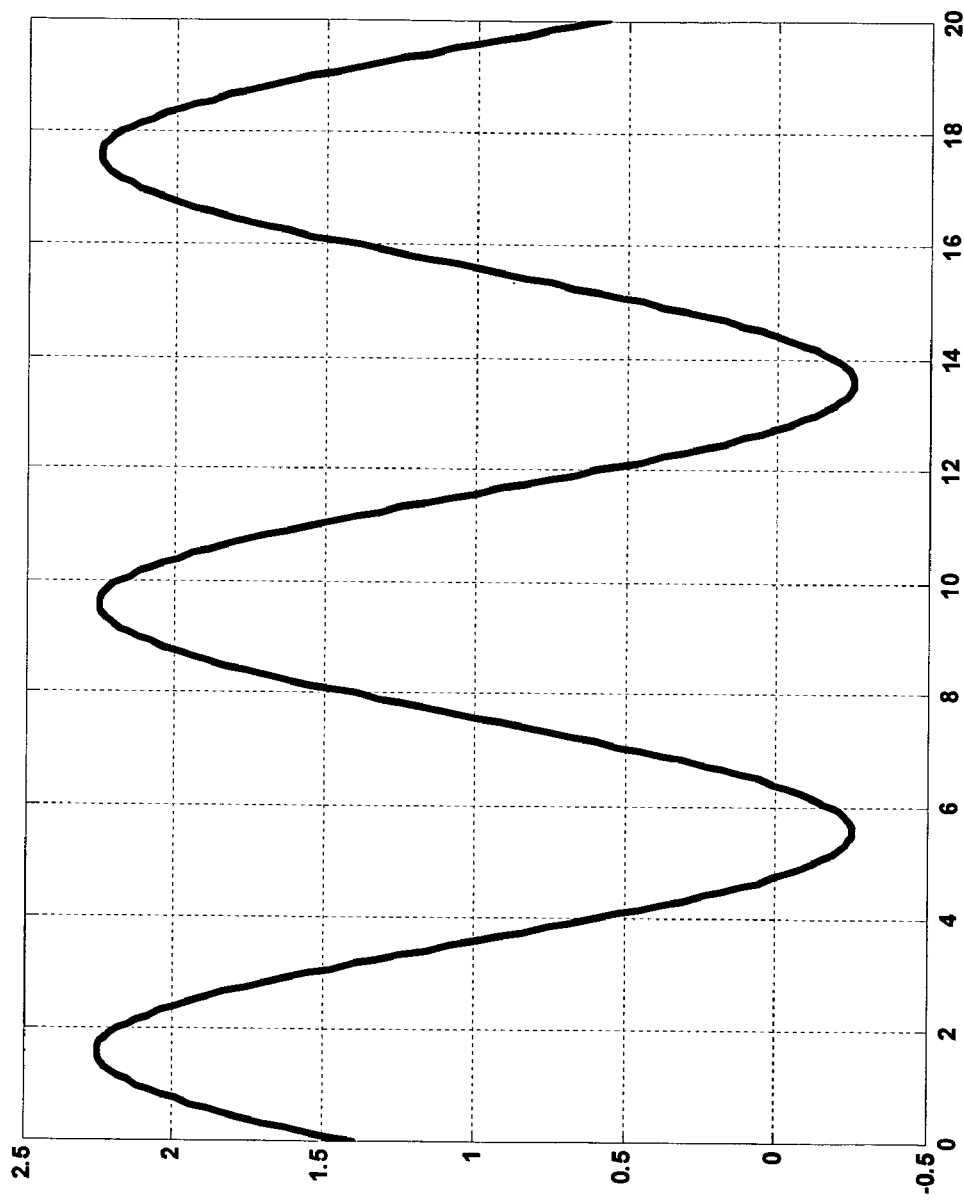
FIG. 14 shows the full scale signal for the CTΣΔADC.

FIG. 14 shows the full scale signal for the CTΣΔADC of FIG. 7 where $I_B$ satisfies (13). Specifically, a DC offset of +1.0 is observed, corresponding to the desired offset.

Returning to FIG. 13, as can be seen, input signal range example 3 is the range

[−1.125; 0.125] Volts.

Thus, this input range has a DC offset of −0.5 Volts and is only half the magnitude of the example input range 1. Thus, according to (9), (10), and (11), the input resistor and bias current generator must satisfy $$R_I = \frac{R_{REF}}{2} \text{ and } I_B = -\frac{1.0}{R_I} = -\frac{2.0}{R_{REF}}. \quad (14)$$

Figure 15:
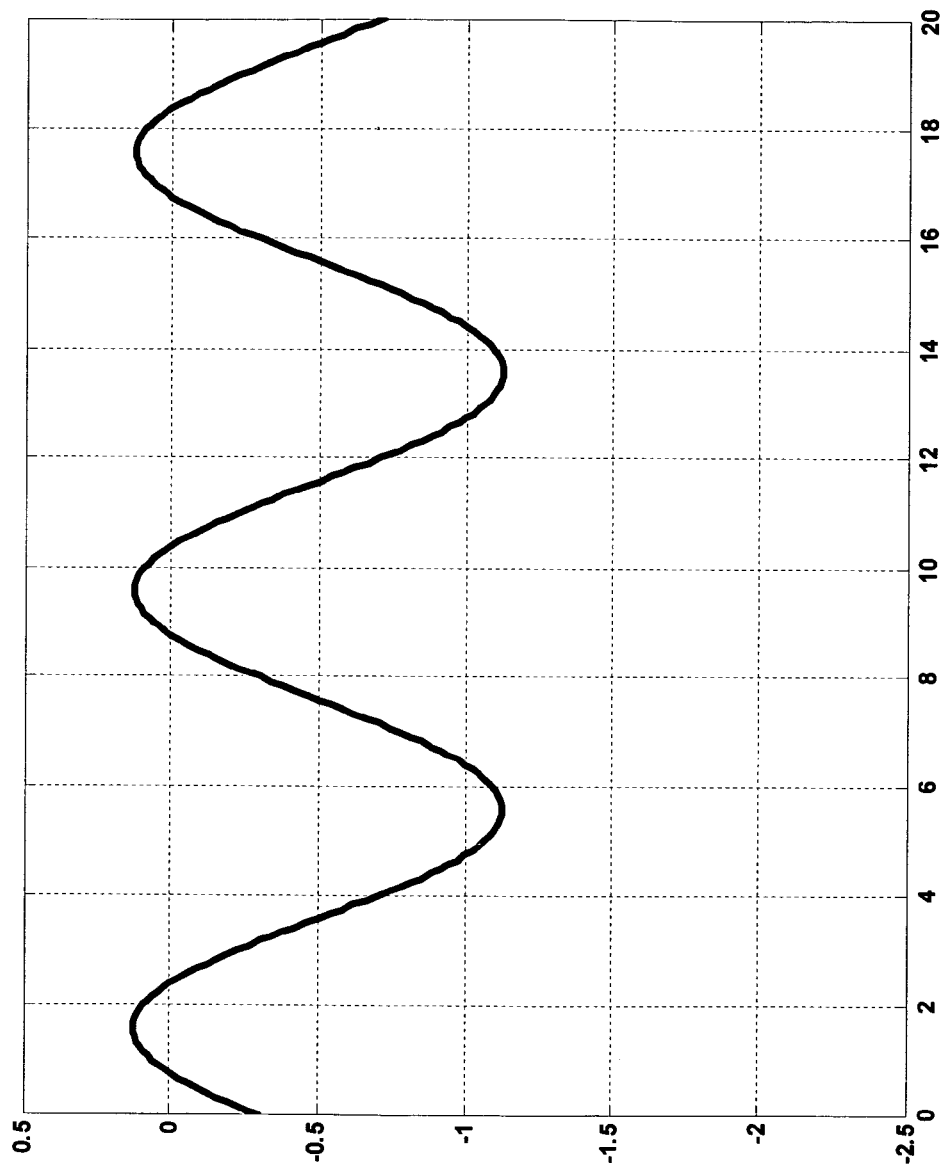
FIG. 15 shows the full scale signal for the CTΣΔADC.

FIG. 15 shows the full scale signal for the CTΣΔADC of FIG. 8 where $R_I$ and $I_B$ satisfy (14). Specifically, a DC offset of −0.5 and input range magnitude of 1.25 is observed, as desired.

Figure 16:
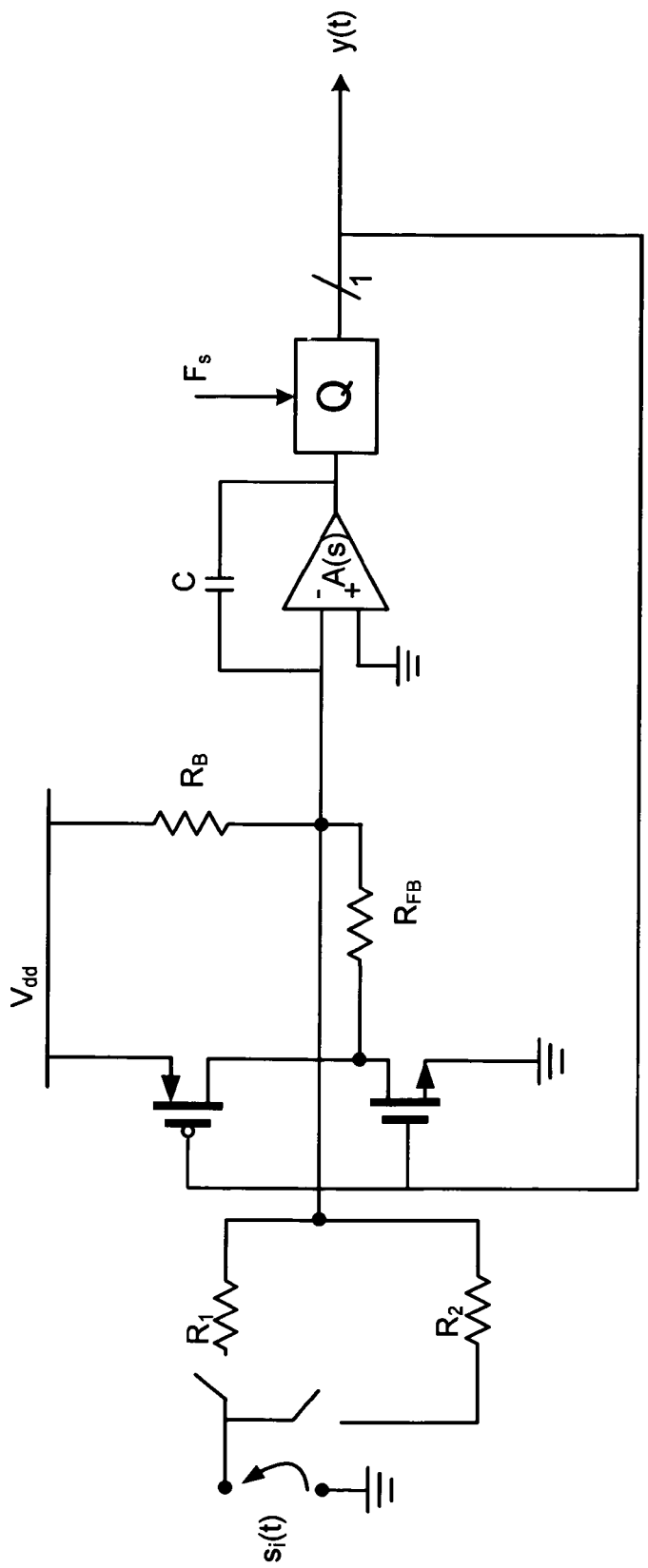
FIG. 16 shows an example implementation of a simple first-order CTΣΔADC in accordance with the present invention.

FIG. 16 shows an example implementation of a simple first-order CTΣΔADC in accordance with the present invention. The bias voltage of the positive operational amplifier terminal is equal to half the supply voltage, i.e., $V_B=V_{dd}/2$. This CTΣΔADC employs a single-bit quantizer and the feedback currents are thus binary. If the ADC output is "high", transistor T2 is on and T1 is off and a negative feedback current flows into the summing node via $R_{FB}$. If the ADC output is "low", transistor T1 is on, T2 is off, and positive feedback current flows into the summing node via $R_{FB}$. The resistor $R_B$ provides an offset current to generate a DC offset on the input range. In this figure, $R_B$ is connected to $V_{dd}$, resulting in positive current flow into the operational amplifier summing node; hence, according to (9), a negative input range offset is generated. Two switchable input resistors, $R_1$ and $R_2$, provide the ability to switch between two different input range magnitudes.

Figure 17:
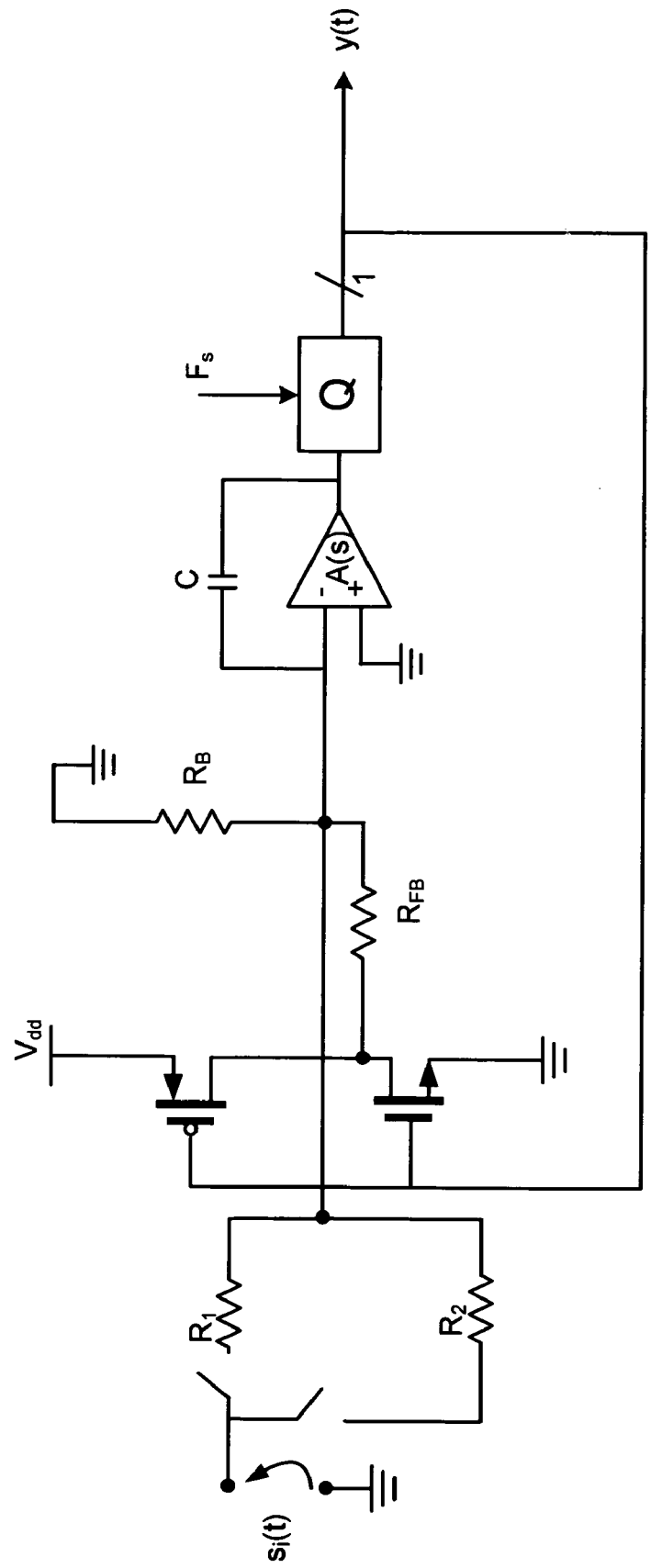
FIG. 17 shows an example implementation of a simple first-order CTΣΔADC wherein a bias resistor $R_B$ is connected to ground.

The first-order CTΣΔADC shown in FIG. 17 is similar to the one shown in FIG. 16, except the bias resistor $R_B$ is connected to ground. This provides a negative bias current into the summing node of the operational amplifier, hence, according to (9), a positive input range DC offset results.

Figure 18:
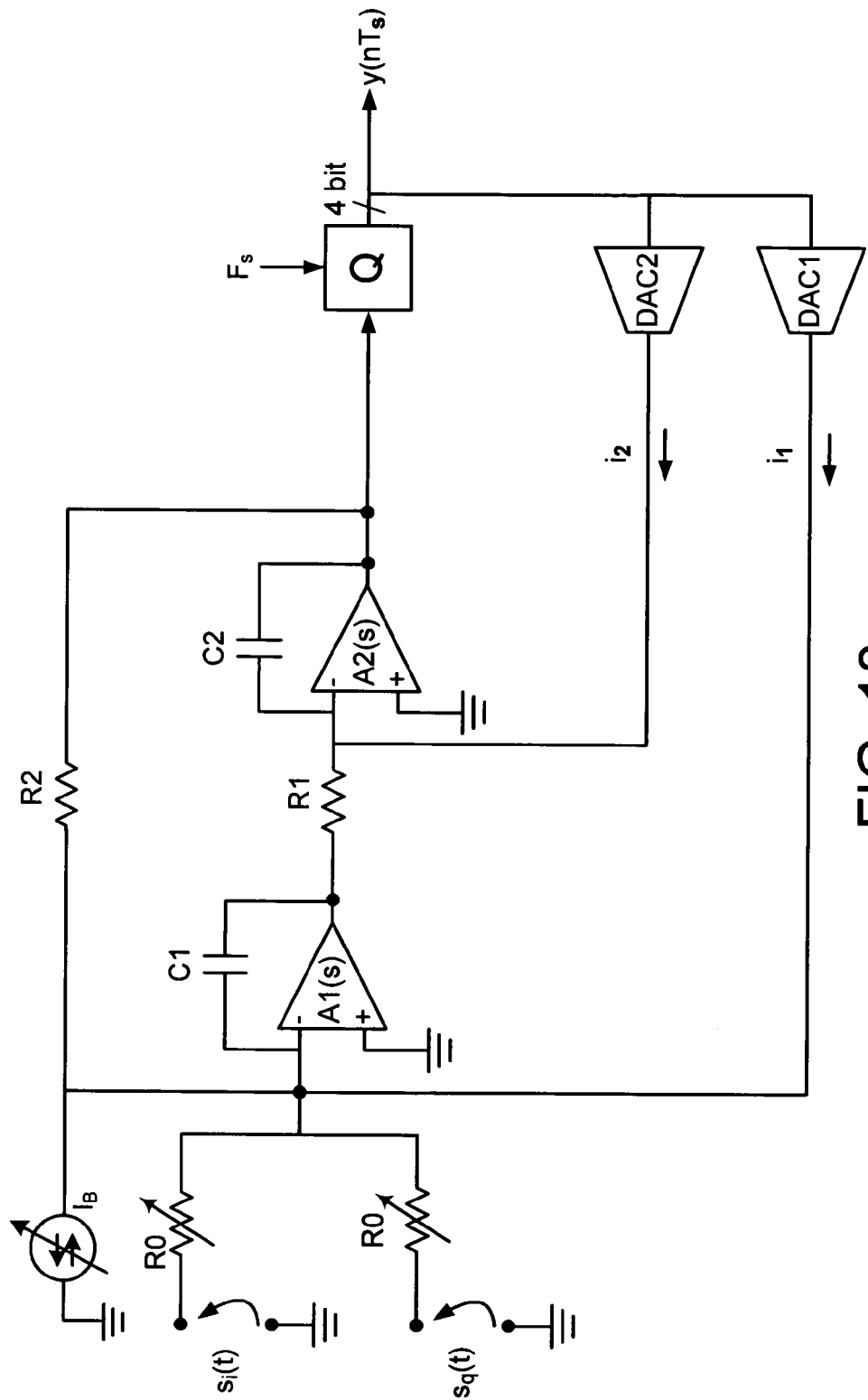
FIG. 18 shows a second order CTΣΔADC with dual inputs.
Figure 19:
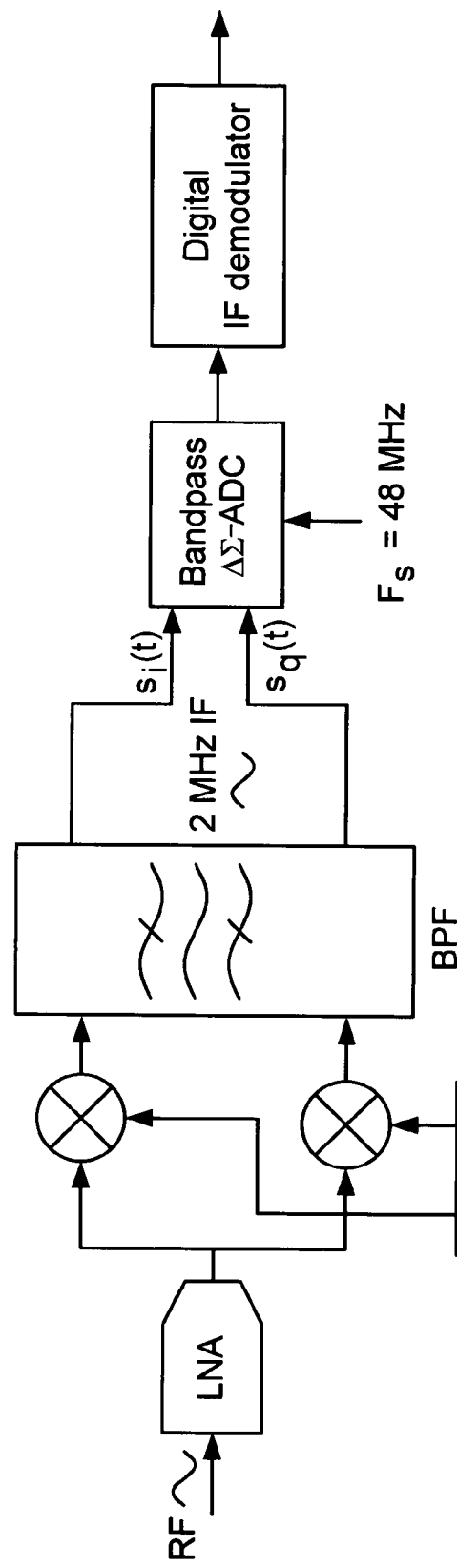
FIG. 19 shows a second order CTΣΔADC with dual inputs corresponding to in-phase and quadrature (I/Q) components of a wireless RF receiver.

The results of the above analysis can readily be extended to higher order CTΣΔADCs. For example, FIG. 18 shows a second order CTΣΔADC with dual inputs. These inputs correspond to in-phase and quadrature (I/Q) components of the wireless RF receiver shown in FIG. 19. As for the case of the single-input ADCs discussed above, the input bias current generator $I_B$ generates an offset on the input signal ranges. In this case, however, the input DC offset on each input branch is given by $$s_{DC} = -\frac{I_B R_I}{2} \quad (15)$$

since each input contributes equally in canceling the bias current.

Figure 20:
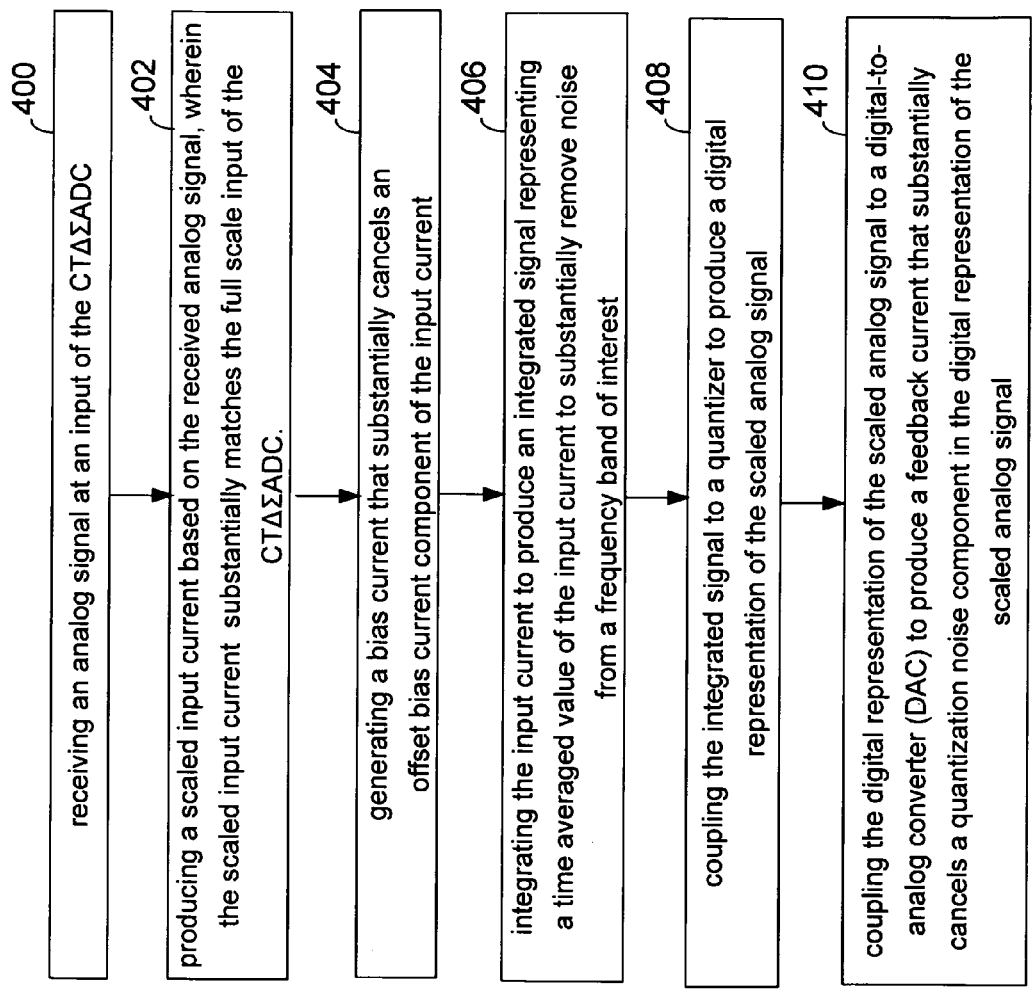
FIG. 20 is a flow chart illustrating one method of the present invention.

FIG. 20 is a flow chart illustrating one method of the present invention. A first step comprises receiving an analog signal at an input of the CTΔΣADC (step 400). Additionally, the method includes producing a scaled input current based on the received analog signal, wherein the scaled input current substantially matches the full scale input of the CTΔΣADC (step 420). Producing the scaled input current comprises selecting and coupling a programmable input resistance value between the CTΔΣADC input and the integrator input. Thereafter, the method according to the present embodiment of the invention includes generating a bias current that substantially cancels an offset bias current component of the input current (step 404). In one embodiment, this step includes selecting and coupling a variable bias resistance value between the integrator input and one of a supply voltage and a circuit common. The method further includes integrating the input current to produce an integrated signal representing a time averaged value of the input current to substantially remove noise from a frequency band of interest (step 406).

The method further includes coupling the integrated signal to a quantizer to produce a digital representation of the scaled analog signal (step 408). Finally, the method according to the described embodiment of the invention includes coupling the digital representation of the scaled analog signal to a digital-to-analog converter (DAC) to produce a feedback current that substantially cancels a quantization noise component in the digital representation of the scaled analog signal (step 410). Producing the feedback current comprises coupling the digital representation of the scaled analog signal to a programmable digital switch wherein the programmable digital switch either sinks current from or sources current to the integrator input. In one embodiment, the magnitude of the digital switch current is selected by a programmable feedback resistance operably coupled by the digital switch to one of a supply voltage or a circuit common.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

What is claimed is:

1. A method for generating a digital signal based upon an analog signal, comprising:
   producing a time varying input signal to a variable resistor;
   producing an output of the variable resistor to an input of an integrator;
   one of sinking current from the input of the integrator or sourcing current to the input of the integrator based upon direct current levels of the time varying input signal to offset the direct current levels;
   setting current levels to be sunk from or sourced to the input of the integrator;
   setting a resistance level of the variable resistor; and
   producing an integrated output from the integrator to a continuous time delta sigma analog to digital converter (CT$\Delta\Sigma$ADC).

2. The method of claim 1 further includes the integrator producing a scaled input current based on the received analog signal, wherein the scaled input current substantially matches a full scale input of the CT$\Delta\Sigma$ADC.

3. The method of claim 2 wherein the step of producing an integrated output includes integrating the scaled input current to produce an integrated signal representing a time averaged value of the scaled input current to substantially remove noise from a frequency band of interest.

4. The method of claim 3 wherein the CT$\ominus\Sigma$ADC is operable to produce a digital representation of a scaled analog signal.

5. The method of claim 4 wherein coupling the digital representation of the scaled analog signal to CT$\Delta\Sigma$ADC to operates to produce a feedback current that substantially cancels a quantization noise component in the digital representation of the scaled analog signal.

6. An integrated circuit radio transceiver, comprising:
   transceiver circuitry for receiving and transmitting RF signals;
   conversion circuitry operable to generate a digital representation of a time varying ingoing signal produced by the transceiver, the conversion circuitry further comprising:
   a variable resistor operably coupled to receive the time varying ingoing signal;
   an integrator operably disposed to receive an output of the variable resistor at an input;
   a current source operably disposed to sink and source current from the input based upon direct current levels of the time varying input signal wherein the current source is operable to offset the direct current levels;
   control circuitry for setting current levels to be sunk from or sourced to the input of the integrator,
   control circuitry for setting a resistance level of the variable resistor; and
   wherein the integrator is operable to produce an integrated output from the integrator to a continuous time delta sigma analog to digital converter (CT$\Delta\Sigma$ADC).

7. The integrated circuit radio transceiver of claim 6 wherein the integrator produces a scaled input current based on the received analog signal, and wherein the scaled input current substantially matches a full scale input of the CT$\Delta\Sigma$ADC.

8. The integrated circuit radio transceiver of claim 7 wherein the integrator produce an integrated signal representing a time averaged value of the scaled input current to substantially remove noise from a frequency band of interest.

9. The integrated circuit radio transceiver of claim 8 wherein the CT$\Delta\Sigma$ADC is operable to produce a digital representation of a scaled analog signal.

10. The method of claim 9 wherein the digital representation of the scaled analog signal to CT$\Delta\Sigma$ADC operates to produce a feedback current that substantially cancels a quantization noise component in the digital representation of the scaled analog signal.

11. A programmable input range Continuous-Time Delta-Sigma Analog-to-Digital Converter (CT$\Delta\Sigma$ADC), comprising:
   a first programmable input block operably coupled to receive an in-phase component of analog signal and operable to produce a scaled in-phase component of the analog signal;
   a second programmable input block operably coupled to receive a quadrature-phase component of analog signal and operable to produce a scaled quadrature-phase component of the analog signal;
   a variable current source operable to sink or source a current from a node operably disposed to receive the scaled in-phase and quadrature-phase components of the analog signal;

at least one integrator operably coupled to a scaled analog signal with a substantially canceled direct current component to produce at least one integrated output; and a quantizer operably coupled to receive the at least one integrated output and for producing a digital output having a digital value coarsely reflecting an amplitude of the analog signal wherein the at least one integrated output is scaled to match an input range of the quantizer.

12. The CTΔΣADC of claim 11 further including at least one programmable digital-to-analog converter (DAC) operably coupled to receive and to convert the quantizer digital output to an analog programmable feedback current coupled to an integrator input.

13. The CTΔΣADC of claim 11 further including a programmable bias current block operably coupled to the integrator input to produce a programmable bias current to substantially cancel a bias voltage component of the received analog signal.

14. The CTΔΣADC of claim 11 further including logic operably coupled to select an offset bias voltage level to the CTΔΣADC based on at least one of a received analog signal input magnitude and an offset bias voltage component of the received analog signal.

15. The CTΔΣADC of claim 9 wherein the first and second programmable input block each comprises a selectable value input resistive element operably coupled to receive the analog signal and to produce an input current to the integrator input, wherein the input current is proportional to the received analog signal.

16. The CTΔΣADC of claim 15 wherein the selectable value input resistive element comprises one of a resistor and a transistor.

17. The CTΔΣADC of claim 16 wherein the programmable bias current block comprises a variable bias resistive element operably coupled to the integrator input and to a first digital switch, wherein the first digital switch is selectively controlled to couple the variable bias resistive element to one of a supply voltage and to a circuit common.

18. The CTΔΣADC of claim 17 wherein the first digital switch and the variable bias resistive element are operably controlled by the logic.

19. The CTΔΣADC of claim 18 wherein the variable feedback resistive element's value is selected to produce a programmable feedback current magnitude that substantially cancels a quantization noise component present in the quantizer digital output.

* * * * *